United States Patent [19]
Kovacic et al.

[11] Patent Number: 5,841,930
[45] Date of Patent: Nov. 24, 1998

[54] SEMICONDUCTOR OPTICAL WAVEGUIDE

[75] Inventors: Stephen J. Kovacic, Kanata; Jugnu J. Ojha, Oakville, both of Canada

[73] Assignee: Northern Telecom Limited, Montreal, Canada

[21] Appl. No.: 899,884

[22] Filed: Jul. 24, 1997

Related U.S. Application Data

[62] Division of Ser. No. 609,930, Feb. 29, 1996, Pat. No. 5,682,455.

[51] Int. Cl.$^6$ ........................................... G02B 6/10
[52] U.S. Cl. ............................................. 385/131; 372/45
[58] Field of Search .................... 385/129–132, 385/14; 372/45, 50; 257/22

[56] References Cited

U.S. PATENT DOCUMENTS

| | | | |
|---|---|---|---|
| 4,658,402 | 4/1987 | Kobayashi | 372/50 |
| 4,727,556 | 2/1988 | Burnham et al. | 372/50 |
| 4,771,010 | 9/1988 | Epler et al. | 437/19 |
| 4,788,689 | 11/1988 | Tokuda et al | 372/45 |
| 4,843,032 | 6/1989 | Tokuda et al. | 257/22 |
| 4,857,971 | 8/1989 | Burnham | 372/45 |
| 4,875,216 | 10/1989 | Thornton et al. | 372/45 |
| 5,179,615 | 1/1993 | Tanaka et al. | 385/131 |
| 5,329,601 | 7/1994 | Nakamura | 385/41 |
| 5,521,994 | 5/1996 | Takeuchi et al. | 385/14 |
| 5,570,439 | 10/1996 | Tatemi Ido et al. | 385/37 |
| 5,574,289 | 11/1996 | Aoki et al. | 385/130 |
| 5,678,935 | 10/1997 | Sakata | 385/131 |
| 5,682,455 | 10/1997 | Kovacic et al. | 385/131 |

OTHER PUBLICATIONS

R. A. Soref., "Silicon–Based Optoelectronics", Proceedings of the IEEE, vol. 81. No. 12, Dec. (1993), pp. 1687–1706.

F. Namavar., "Optical Waveguiding in $Si/Si_{1-x}Ge_x/Si$ Heterostructures", J. Appl. Phys., vol. 70, No. 6, Sep. (1991), pp. 3370–3372.

*Primary Examiner*—Akm E. Ullah

[57] ABSTRACT

A channel waveguide structure which can be incorporated into VLSI (very large scale integration) integrated circuits uses a SiGe (silicon germanium) alloy core and Si (silicon) top and bottom cladding layers. The core may consist of only a SiGe alloy layer or it may be formed as a superlattice containing Si layers alternating with SiGe alloy layers. LOCOS (locally oxidized silicon) regions are formed on the top cladding layer at spaced locations thereby defining lateral boundaries of channels in the core.

29 Claims, 13 Drawing Sheets

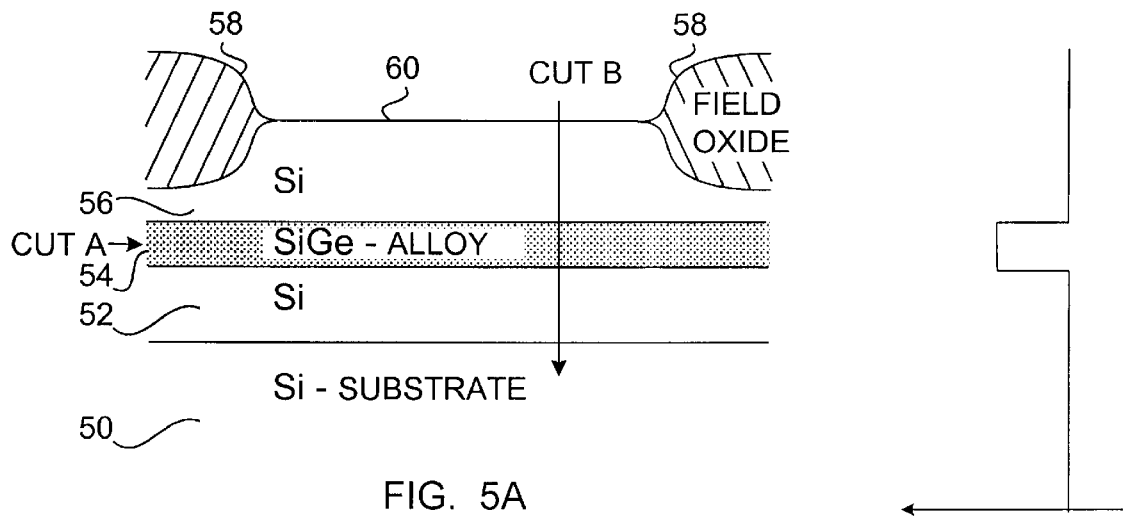
FIG. 5A
FIG. 5C
EFFECTIVE INDEX OF REFRACTION
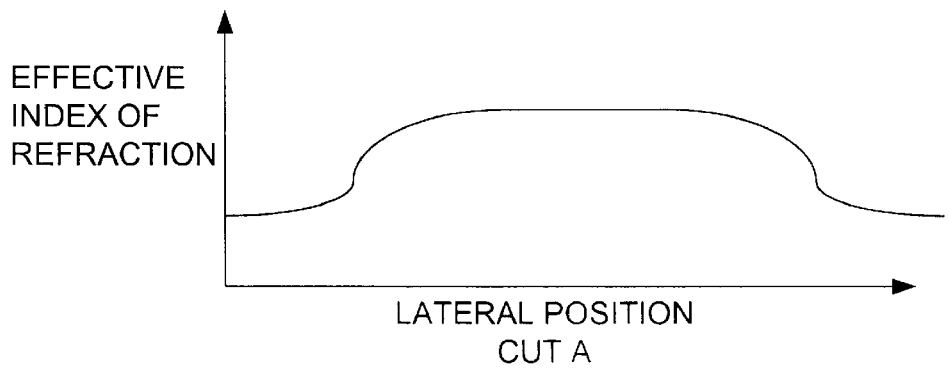
FIG. 5B

SEMICONDUCTOR OPTICAL WAVEGUIDE

This application is a division of application Ser. No. 08/609,930, filed Feb. 29, 1996 now U.S. Pat. No. 5,682,455.

FIELD OF THE INVENTION

This invention relates to semiconductor optical waveguides and a method of making a semiconductor optical waveguide compatible with existing methods of making integrated circuits.

BACKGROUND OF THE INVENTION

Optoelectronic integrated circuits (OEICs) by definition comprise electronic devices integrated together with active and passive optical devices and enable the concurrent manipulation of both optical and electrical signals. An OEIC designer is able to use the best properties of both optical and electronic devices. Optoelectronic components may be integrated onto a semiconductor wafer either monolithically, where all of the optoelectronic components are fabricated on the wafer, or in hybrid fashion, where some or all of the components are fabricated separately and attached to the wafer.

Efficient coupling and transport of light amongst optoelectronic components integrated onto a semiconductor wafer is a fundamental requirement of OEICs. Such connectivity enables a high degree of functionality to be integrated onto the semiconductor wafer, helping to achieve the primary objectives of OEICs, these being compactness, ease of manufacture, and robustness. One means of accomplishing these objectives is to interconnect distinct optoelectronic components with optical waveguides. An optical waveguide provides a low-loss, confined pathway for the propagating optical signal.

Traditional planar waveguides have been implemented using a structure consisting of a core layer between two cladding layers (see FIG. 1). The index of refraction of the core is larger than the index of the adjacent cladding layers at the optical wavelength of the light propagating within the waveguide. The index of refraction is a property of a material and will vary with the optical wavelength of the light propagating within the material.

For any particular waveguide structure more than one pattern of optical energy distribution across the waveguide may exist. Each pattern defines a mode of the waveguide. A propagating optical signal will have some energy in each allowable mode of the waveguide. However, the lowest order mode will carry the largest percentage of optical energy. The modes that a designed waveguide will sustain are determined by the physical dimensions of the various layers, the properties of the core and cladding layer materials, the difference between the index of refraction of the core and the cladding, and the degree of absorption in the core and cladding layers. A planar waveguide is typically designed such that all the optical energy is confined to the plane of the waveguide by virtue of total internal reflection of the propagating optical signal. However, in the lateral direction the light is free to diffuse.

In a channel waveguide, the light is confined in both the lateral direction and the vertical direction by defining a variation in the index of refraction or the effective index of refraction laterally as well as vertically.

Typically, such optical waveguides have been constructed of group III and group V (referring to the periodic table of the elements) compounds. For example, binary compounds such as GaAs for the cladding and ternary compounds such as InGaAs for the core have been used. These are not easily fabricated on a semiconductor wafer.

A major challenge has been and remains how to integrate OEICs within silicon based VLSI (very large scale integration) integrated circuits which have been well established for many years.

Such VLSI integrated circuits typically comprise both CMOS (complementary metal oxide semiconductor) transistors and bipolar transistors which may be used, for example, in telecommunications applications requiring high speed, high drive, mixed voltage and analog-digital performance.

In contrast to the fabrication of waveguides, VLSI integrated circuits are based on a single semiconductor element, namely silicon. More particularly, bipolar and CMOS devices are constructed by establishing defined regions of N type and P type doped silicon material and physically making electrical contact to those regions as required to supply or extract electronic current or voltage.

Silicon VLSI processing may entail the formation of a device well. The device well does not contribute to the functionality of the device per se, but simply serves to electrically isolate adjacent devices. The device well may be an area of silicon which is surrounded by thick oxide formed using the process of local oxidation of silicon (LOCOS) or by other means including silicon dioxide deposition. Alternatively, a device well may be created by etching deep trenches around an area of silicon.

In addition to doping and oxidation processes, silicon VLSI processing may entail exposure of the wafer to high temperatures and oxidizing ambients. For example, the LOCOS process may require that the wafers be placed in an oxygen environment at temperatures greater than 1000 degrees Celsius. Thus, any additional structural attributes or material characteristics associated with and relied upon by the passive and active optical devices must be able to sustain the conventional steps required in the formation of modern VLSI circuits on a silicon substrate.

A first step in integrating OEICs within silicon VLSI circuits is to establish an optical waveguide structure compatible with the silicon VLSI manufacturing technique.

Proposals in this area have already been made. For example, Namavar and Soref [1] have proposed a planar waveguide based on silicon in which cladding layers are silicon and the core is a silicon germanium alloy (FIG. 2). Additionally, Soref [2] has proposed a channel waveguide in which a silicon germanium alloy is formed on a silicon substrate and a ridge is formed in the silicon germanium layer (FIG. 4).

The existing waveguides do not meet the considerable challenge of optimizing the performance of both CMOS and bipolar devices, concurrent with the optimization of optical waveguides and other optoelectronic components on the same substrate. They do not offer a manufacturable fabrication process for minimum geometry integrated circuits and waveguides which does not inordinately increase the existing VLSI process complexity. Instead, they result in an increase in the number of photolithographic mask levels and process steps, requiring reactive ion etching. Ridges introduce surface topography which is detrimental to photolithographic resolution. In addition, it is not clear that these methods of fabrication produce a VLSI circuit which performs equally well regardless of the presence of the optical waveguides.

SUMMARY OF THE INVENTION

An object of the invention is to provide an integrated circuit including a semiconductor optical channel waveguide and a method of making semiconductor optical channel waveguides which overcomes or reduces the above-mentioned problems.

The invention broadly involves providing on a suitable substrate a basic waveguide structure comprising top and bottom cladding layers and a core therebetween. The core is formed of at least one layer of a silicon semiconductor alloy. The core and cladding layers preferably form a crystal which is substantially free of dislocations. A preferred alloy is SiGe alloy in which the fraction of germanium is chosen such that the core has a predetermined increase in the index of refraction relative to the top and bottom cladding layers.

The cladding layers are preferably silicon, but suitable silicon alloys may be used instead. Again, SiGe is a suitable alloy but if that is also used for the core, the fraction of germanium in the cladding must be made different than that of the core such that the index of refraction in the core is greater.

Instead of a single layer the core may comprise a predetermined series of layers of different materials. In one preferred embodiment, these layers are silicon and silicon germanium. The series, for example, may form a superlattice or a multiple quantum well.

An important aspect of the invention is the way a channel is formed in the waveguide structure. This may be done by forming spaced LOCOS (locally oxidized silicon) regions in the top cladding layer to define lateral boundaries of the channel. Alternatively, trenches may be provided which extend through at least a portion of the top cladding layer and preferably through a portion of the core. The trenches are filled with a material having an index of refraction less than that of the core and in some cases less than that of the cladding.

BRIEF DESCRIPTION OF THE DRAWINGS

Embodiments of the invention will now be described by way of example, with reference to the attached drawings in which:

FIG. 5a is a cross-sectional view through a semiconductor optical channel waveguide comprising part of an integrated optoelectronic integrated circuit according to a first embodiment of the present invention;

FIG. 5b is a plot of the index of refraction of the layered structure of FIG. 5a taken along cut A;

FIG. 5c is a plot of the effective index of refraction of the layered structure of FIG. 5a taken along cut B;

DESCRIPTION OF THE PREFERRED EMBODIMENT

Figure 1:
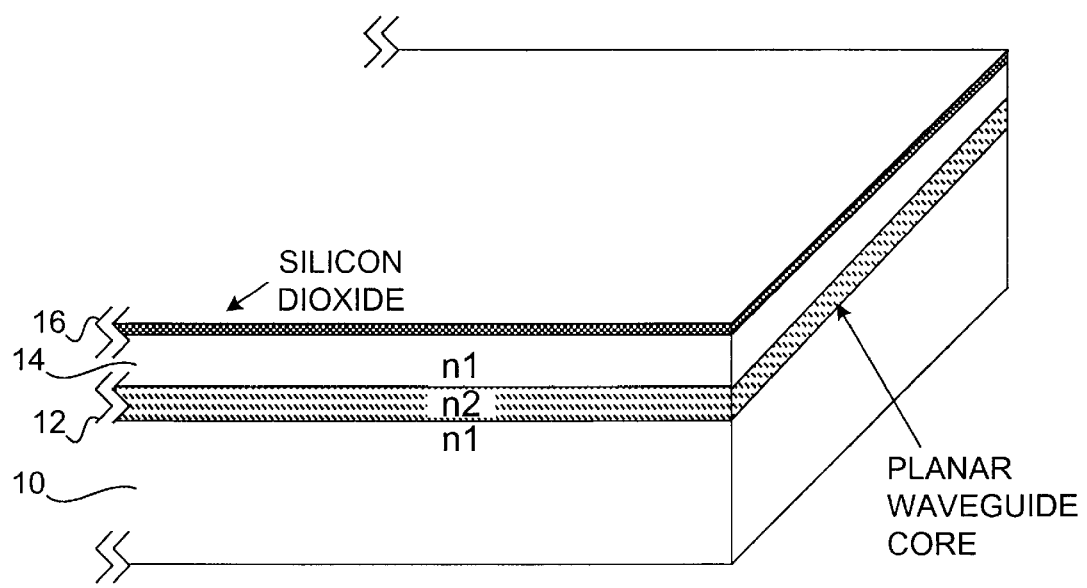
FIG. 1 is an isometric view of part of a conventional prior art semiconductor optical planar waveguide.

Part of a conventional prior art planar optical waveguide is shown in FIG. 1. The optical waveguide includes a planar waveguide core 12 having an index of refraction value equal to n2, disposed between a first layer of top cladding 14 and bottom cladding 10. The bottom cladding 10 and the first layer of top cladding 14 both have an index of refraction equal to n1. The core 12 of the waveguide is a material having a predetermined index of refraction n2 greater than the index of refraction n1 of the cladding layers 10,14. Examples of materials typically used in the core/cladding are AlGaAs/GaAs or InGaAsP/InP. A layer of silicon dioxide 16 may also be deposited upon the top cladding layer and, in fact, may form part of the top cladding layer. Waveguides made of these materials are not suitable for conventional VLSI integration.

Figure 2:
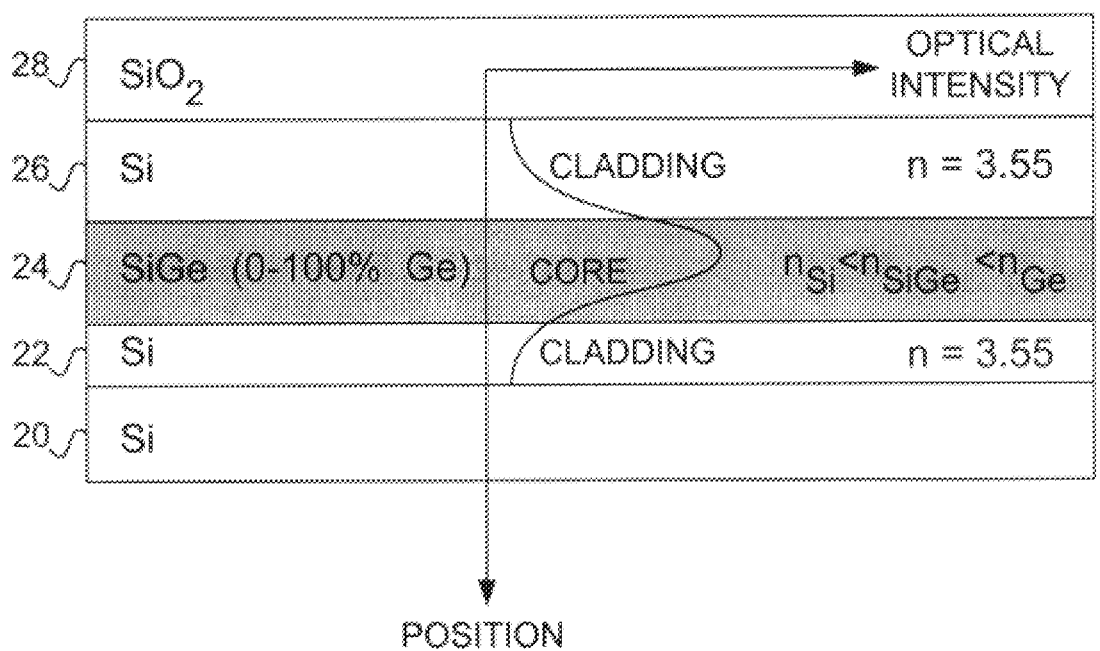
FIG. 2 is a cross-sectional view through a conventional semiconductor optical planar waveguide.

A basic semiconductor optical waveguide which can be implemented on a semiconductor wafer has been described by Namavar and Soref [1]. A sectional view of such a planar waveguide comprising part of an optoelectronic integrated circuit is shown in FIG. 2. The semiconductor optical waveguide is formed on a silicon substrate 20 such as a conventional silicon semiconductor wafer. It has a bottom cladding layer 22 of silicon overlying the substrate 20. Upon this is formed a silicon-germanium alloy layer 24, that is, $Si_{1-x}Ge_x$ where $0<x<1$. Overlying the silicon-germanium alloy layer 24 there is provided a top cladding layer 26 of silicon. Design parameters including the thickness of the cladding layers 22,26 and core layer 24 and the composition of the alloy in the core layer are selected firstly to provide a predetermined increase in the index of refraction in the core with respect to the cladding layers. Secondly, they are selected so as to provide a predetermined optical energy confinement factor, the confinement factor for a waveguide being a measure of the amount of light confined to the waveguide core. FIG. 2 includes a typical plot of the optical intensity across the layers of the waveguide for the primary mode of propagation. The confinement factor in this case is the ratio of the optical energy in the core to the total optical energy being propagated in the waveguide. A third criterion for selecting the design parameters is that they provide after oxidation, a layer of silicon dioxide 28 which penetrates the top cladding layer 26 to a predetermined depth. The silicon dioxide layer 28 acts as a second layer of cladding in addition to the top cladding layer 26.

A planar waveguide is in itself not very useful because it offers no lateral confinement of light. A channel waveguide is a waveguide which does provide lateral confinement and allows the guiding of light from one specific point in a circuit to another point.

Figure 3:
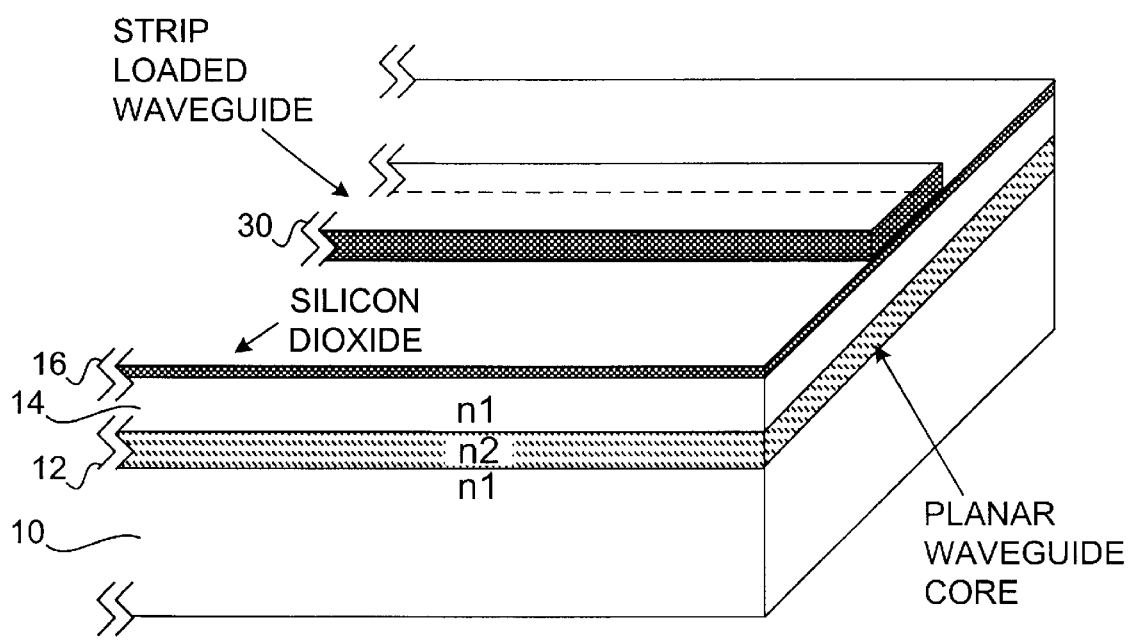
FIG. 3 is an isometric view of part of a conventional prior art semiconductor optical channel waveguide.

A known type of semiconductor optical channel waveguide is shown in FIG. 3. This waveguide has a layered structure made from the same traditional waveguiding materials as the planar waveguide of FIG. 1. In addition, a ridge 30 is etched in the top cladding. In the illustrated example, the ridge 30 is formed in the layer of top cladding 16 made of silicon dioxide. In the region under the ridge 30, the top cladding is thicker than elsewhere. This results in an effective index of refraction in the region of the ridge 30 which is greater than elsewhere. This lateral variation in the effective index of refraction is sufficient to confine light laterally to a region of the waveguide proximate the ridge. Vertical confinement is achieved as a result of the layered structure, as in a planar waveguide.

Figure 4:
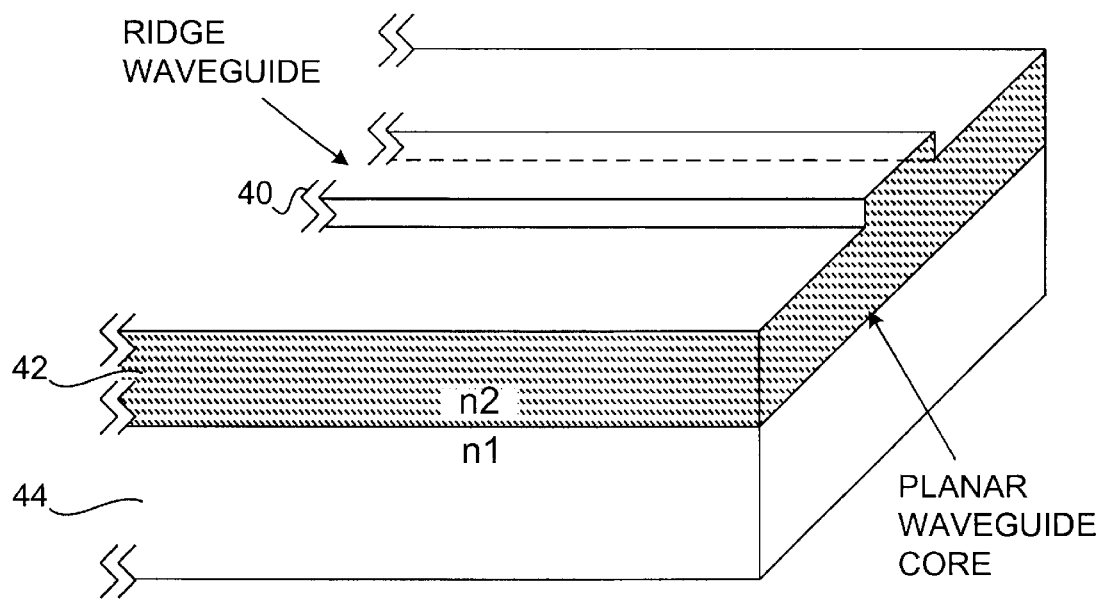
FIG. 4 is an isometric view of part of a prior art semiconductor optical channel waveguide constructed in a manner different from that of FIG. 3.

A second type of channel waveguide can be created by etching a ridge of material on a waveguiding layer. This type of semiconductor optical channel waveguide is shown in FIG. 4. A ridge structure 40 is etched in a waveguiding layer 42 having an index of refraction value equal to n2. The waveguiding layer is situated upon a bottom cladding layer 44 having an index of refraction value equal to n1. The air forms the top cladding in this type of channel waveguide. In the region under the ridge 40, the core layer 42 is thicker than elsewhere. This causes the effective index of refraction of the core region beneath the ridge 40 to be larger than the effective index of refraction elsewhere. In this manner, the lateral variation in the effective index of refraction required for the formation of a semiconductor optical channel waveguide is obtained. This second type of channel waveguide has been fabricated using the traditional materials used in optical waveguides. More recently Soref [2] has proposed using a silicon substrate for the bottom layer 44 and a silicon germanium alloy layer for the wave guiding layer 42 and ridge 40.

Typically, a channel waveguide is formed by photolithography and reactive ion etching of a ridge in either the core, cladding, or both. This process adds complexity and cost to the processing and may not be compatible with conventional VLSI processing. In addition, ridges introduce surface topography which is detrimental to photolithographic resolution.

Referring now to FIG. 5a which illustrates an example of a channel waveguide according to the invention, shown is a layered structure somewhat similar to that of FIG. 2 but with modifications which enable the formation of a channel waveguide instead of a planar waveguide. The layered structure includes a silicon substrate 50, a bottom cladding layer 52 made of silicon or a suitable silicon alloy, a core layer 54 made of a suitable silicon alloy such as SiGe, and a top cladding layer 56 made of silicon or a suitable silicon alloy. The materials of the core and cladding layers are selected such that the core has a predetermined increase in the index of refraction with respect to the cladding layers.

Also shown is a pair of spaced-apart regions of locally oxidized silicon (LOCOS) 58 defined on the surface region extending into the top cladding layer 56, thereby creating a device well 60. This requires that the material in the top cladding layer 56 enable the formation of a silicon oxide. LOCOS has traditionally been employed in conventional silicon fabrication processes to electrically isolate adjacent electronic devices. In the context of a semiconductor waveguide, the effect of the LOCOS regions 58 is to cause a variation in the thickness of the top cladding layer 56. This results in a lateral variation in the effective index of refraction within the core layer 54 and causes optical energy to be confined to the region of the core directly under the device well 60. The lateral variation in the effective index of refraction is illustrated in FIG. 5b. At the same time, the core layer 54 of silicon alloy establishes vertical optical energy confinement. An example of the vertical variation in the index of refraction is illustrated in FIG. 5c. This confinement in both horizontal and vertical directions results in a channel waveguide which confines most of the light to the silicon alloy core between the two LOCOS regions.

The thickness and composition of the core layer 54 and cladding layers 52,56, and the thickness of the LOCOS regions 58 are all selected to create a channel waveguide having a predetermined optical confinement factor.

The thickness of the LOCOS regions 58 is important in that it defines the difference between the thickness of the top cladding layer 56 in the region of the device well 60 and the region beneath the LOCOS regions 58. Furthermore the lateral separation of the LOCOS regions 58 defines the shape of the waveguide. The fact that the thickness and lateral separation of the LOCOS regions 58 are design parameters in the design of waveguides according to the invention is in contrast to conventional uses of LOCOS where the thickness and lateral spacing is less important. In some cases, it may be advantageous to grow a LOCOS layer of uniform thickness, for example the thickness used with conventional VLSI. In this case the waveguide layer thicknesses are designed around that assumption.

In some cases, other optical or electronic devices are to be fabricated on the same substrate. Some of these devices may require an overall crystal which is substantially free of dislocations. A high density of dislocations may for example result in a short circuit in one of the electronic devices. Note that in this context, the crystal being substantially dislocation free means that the semiconductor crystal lattice maintains its crystalline order across the boundaries between the core layer and the cladding layers 52 and 56. Both pseudomorphic crystals and unconditionally stable crystals are substantially dislocation free. An unconditionally stable crystal will maintain its crystalline order at temperatures all the way up to the melting point of the crystal. In contrast, a pseudomorphic crystal will begin to dislocate at temperatures less than the melting point. A difference in the equilibrium lattice constant of the core and that of the cladding introduces strain in the resulting crystal. Strain increases with increasing difference in the lattice constants and with increasing thickness of the core layer. The difference in the lattice constants is determined by the alloy compositions of the layers. If the strain on the crystal is large enough, the crystal will no longer be substantially dislocation free. The requirement for a crystal which is substantially dislocation free is eliminated in the case that no devices other than waveguides are to be fabricated on the same set of layers. It may also be that the other devices fabricated on the structure are physically located relative to the core such that a dislocation free crystal is not a requirement. For example, if the core is buried deep within the crystal then the core may be somewhat isolated from the devices fabricated. In this case, the devices are not effected by dislocations in or near the core. In the absence of the requirement for a dislocation free crystal, thicker core regions and higher alloy fractions may be utilized.

In the case in which the cladding layers 52,56 are silicon and the core 54 is composed of $Si_{1-x}Ge_x$, the alloy will have alloy fraction, x, preferably predetermined to be unconditionally stable in response to the application of any processing steps associated with the formation of all other optical and electrical devices comprising part of the same optoelectronic integrated circuit. A crystal which is substantially dislocation free comprising the core layer 54 of $Si_{1-x}Ge_x$ alloy together with the cladding layers 52, 56 will have no appreciable effect on the formation or characteristics of other optical and electrical devices comprising the optoelectronic integrated circuit. The thickness of the core layer 54 and the fraction of germanium x in this case are determined such that dislocations are not induced in the crystal. Thus for a higher germanium content, there is a reduced maximum thickness before dislocations are induced. A preferred range for the fraction of germanium in the case in which a substantially dislocation free crystal is required is from 0.01 to 0.1. In the case in which this is not a requirement, germanium fractions up to 100% could be used.

As a specific example of the thicknesses of the layers and the core composition for a substantially dislocation free crystal, the core region might be a 5000 Å thick layer of silicon germanium having a 2% germanium content. A suitable thickness for the top cladding and bottom cladding in the region of the channel in this case is 10000 Å. The LOCOS regions may be typically 7000 Å thick resulting in a top cladding layer which is 6920 Å thick beneath the LOCOS regions.

Figure 6:
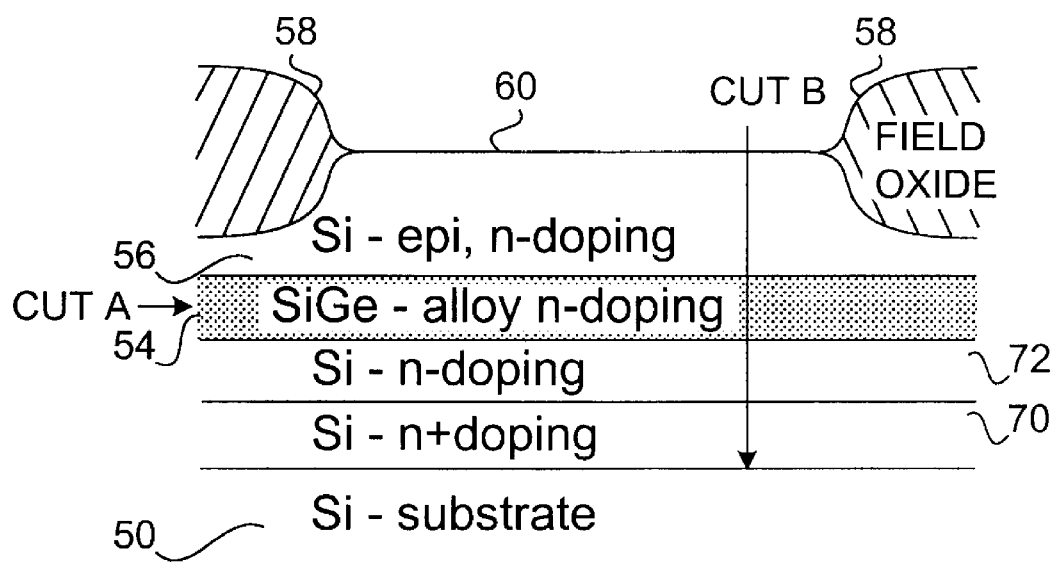
FIG. 6 is a cross-sectional view of a waveguide similar to that of FIG. 5a but in which the layers have been doped.

FIG. 6 illustrates a layered structure according to a modification of the first embodiment shown in FIG. 5. Instead of a single bottom cladding layer 52 as shown in FIG. 5a, two bottom cladding layers 70 and 72 are provided. Layer 70, which is in contact with the silicon substrate 50, is an n+doped buried layer which is provided for use as a bottom electrical contact where required in the formation of electrical devices. The other bottom cladding layer 72 and top cladding layer 56 are n–doped, as is the silicon germanium core layer 54.

The substrate 50 itself is preferably p–doped silicon but it could alternatively be a suitable alloy such as SiGe or some other material such as pure germanium. Any of the layers or regions of the layers including the substrate may be doped in such a manner which enables the fabrication of any particular components, the pattern of doping illustrated in FIG. 6 being particularly suitable to subsequent fabrication of many different devices. The doping of the layers does have a small effect upon the index of refraction, but this effect is generally less than the effect of the silicon germanium in the core.

Figure 9:
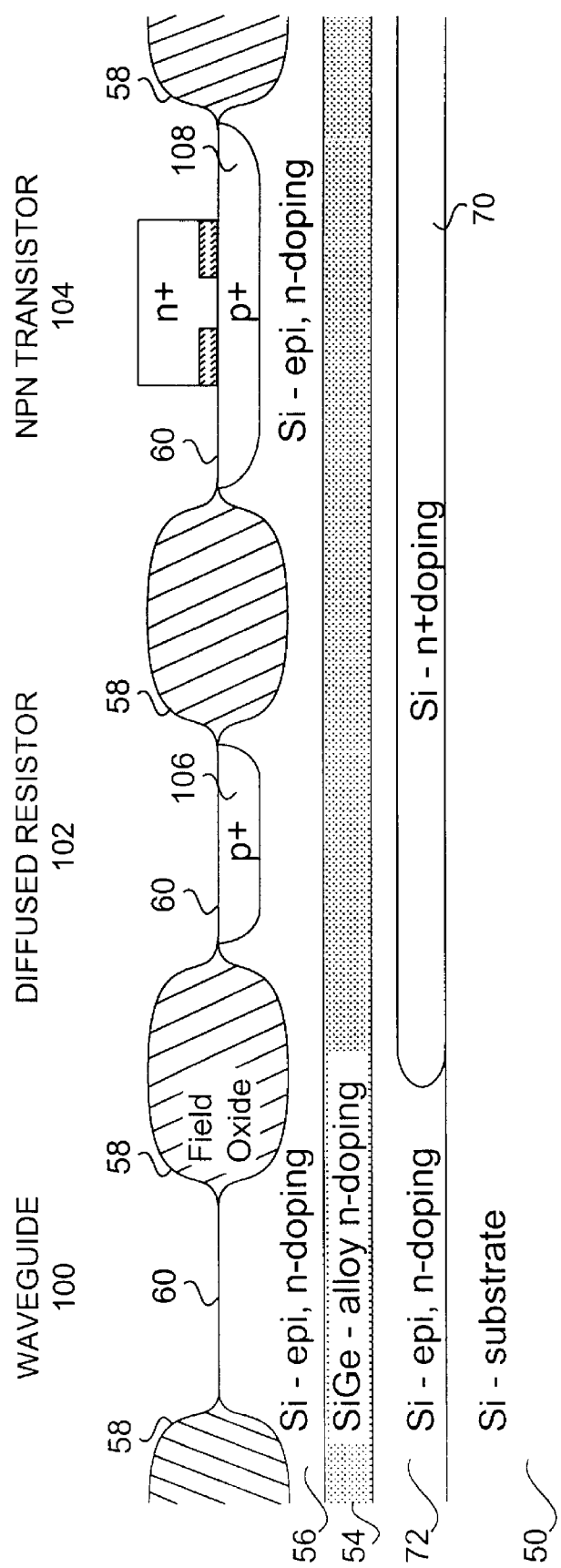
FIG. 9 is a cross-sectional view through a layered semiconductor structure upon which has been fabricated a channel waveguide, a diffused resistor and an NPN transistor constructed according to the invention.

Although FIG. 6 and several subsequent figures depict the n+doped bottom cladding layer 70 as a continuous layer, in practice this doping is usually performed only in regions where devices which require this doping are to be subsequently fabricated, as illustrated in FIG. 9. For example, a waveguide would not normally require this n+doped region whereas an NPN bipolar transistor would require this region for use as a collector. The doping may be done in a layer of cladding 70 on the substrate, or alternatively (not shown) the doping may be done in the substrate layer itself in which case the cladding layers 70,72 become one. In any case, the lines between the substrate, and between the various layers are somewhat artificial because the crystal is continuous along these boundaries.

Figure 7:
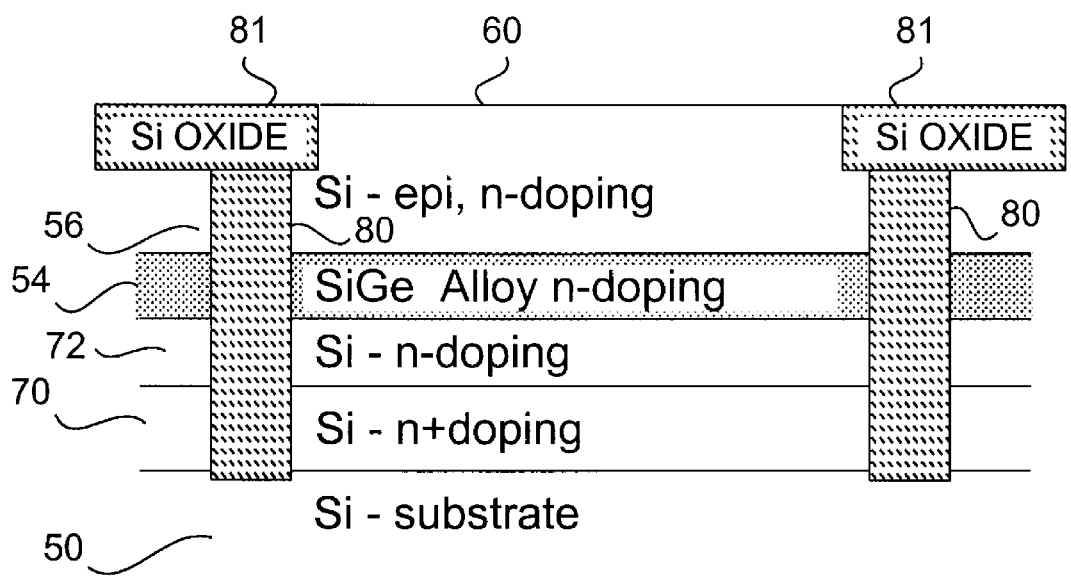
FIG. 7 is a cross-sectional view through a semiconductor optical channel waveguide comprising part of an integrated optoelectronic integrated circuit according to a second embodiment of the present invention.

A semiconductor optical channel waveguide comprising part of an optoelectronic integrated circuit according to a second embodiment of the present invention is shown in FIG. 7. This embodiment may start with the same undoped layered structure as described with reference to FIG. 5. Alternatively, it may have an appropriately doped layered structure, for example, as described with reference to FIG. 6. In contrast to the first embodiment, rather than using two LOCOS regions to define a lateral variation in the effective index of refraction, two spaced-apart regions of trench 80 are etched and filled with a suitable material having an index of refraction less than that of the core and in some cases, also less than that of the cladding. In the illustrated embodiment the trench regions extend from the top cladding layer 56 down through the bottom cladding 70 to the substrate 50. Examples of suitable materials for filling the trench include oxide, an oxide liner filled with polysilicon, and a polymer. Also shown are regions of shallow trench 81 which provide a conventional means of protection for silicon in areas removed from device wells.

This trench isolation provides a predetermined lateral variation in the effective index of refraction within the core layer 54 which confines the optical energy to the region of the core directly between trenches 80. The trenches 80 do not necessarily have to extend all the way to the substrate. They only need be deep enough to provide a desired optical confinement factor. In the case in which the trenches 80 do not penetrate the core, the material in the trenches must have an index of refraction less than that of the cladding. If the trenches 80 do penetrate the core, the material need only have an index of refraction less than that of the core. The shallow trench regions 81 also provide a limited contribution to the lateral isolation. As before, vertical optical energy confinement is achieved with the core layer, which in the illustrated embodiment is composed of SiGe alloy. The alloy fraction is a design parameter as described above for the first embodiment.

The use of trenches has the advantage of allowing higher device density than the use of LOCOS regions because the width of a trench required to isolate adjacent devices is less than the width of an equally effective LOCOS region.

Figure 8A:
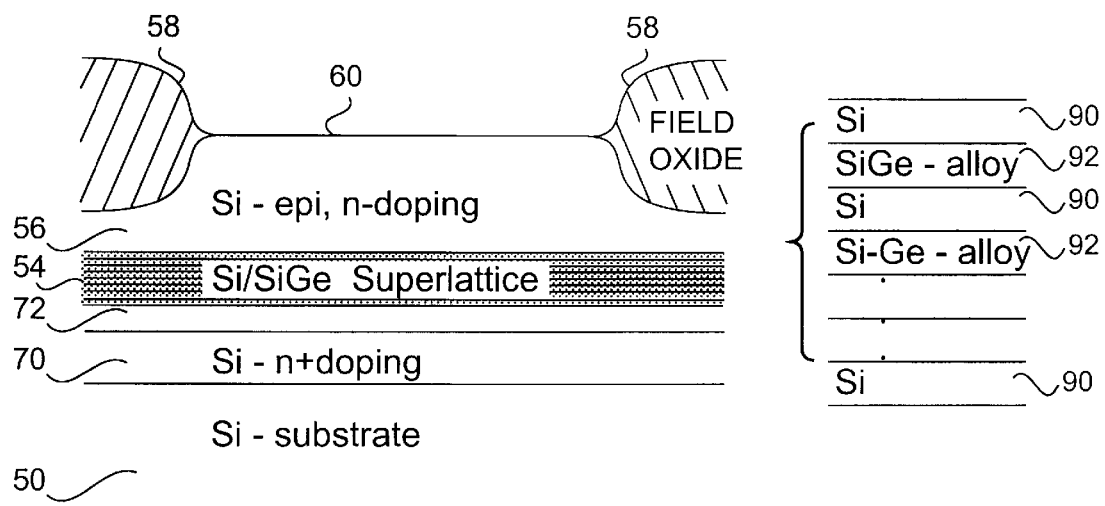
FIG. 8a is a cross-sectional view through a semiconductor optical channel waveguide comprising part of an integrated optoelectronic integrated circuit according to a third embodiment of the present invention.

FIGS. 8a illustrates a semiconductor optical channel waveguide comprising part of an optoelectronic integrated circuit according to a third embodiment of the present invention. This embodiment is similar to the embodiment shown in FIG. 6 with the exception of the structure of the optical channel waveguide core 54. The core in this case is comprised of a predetermined series of layers of silicon or silicon alloys which combine to result in the desired characteristics for the core. In the illustrated embodiment, the core 54 comprises a superlattice consisting of a series of alternating thin layers of silicon 90 and silicon germanium alloy 92.

The composition and thickness of each layer in the core is selected to provide a predetermined increase in the index of refraction and optical energy confinement factor. By using a layered core structure, a core may be constructed which provides a desired relative increase in the index of refraction which may be otherwise difficult to obtain. The layers within the core crystal itself are preferably substantially free of dislocations. As discussed with reference to the first embodiment, in some cases the core and cladding together must form a crystal which is substantially free of dislocations. In these cases, the layers within the core crystal itself must necessarily also be substantially dislocation free. A further advantage of such a layered structure is that there may be less strain in the crystal because each layer is very thin, and as such, dislocation free crystals with thicker core layers may be made. Depending on the layered structure used, a superlattice, multiple quantum well, or other predetermined structure may result.

Figure 8B:
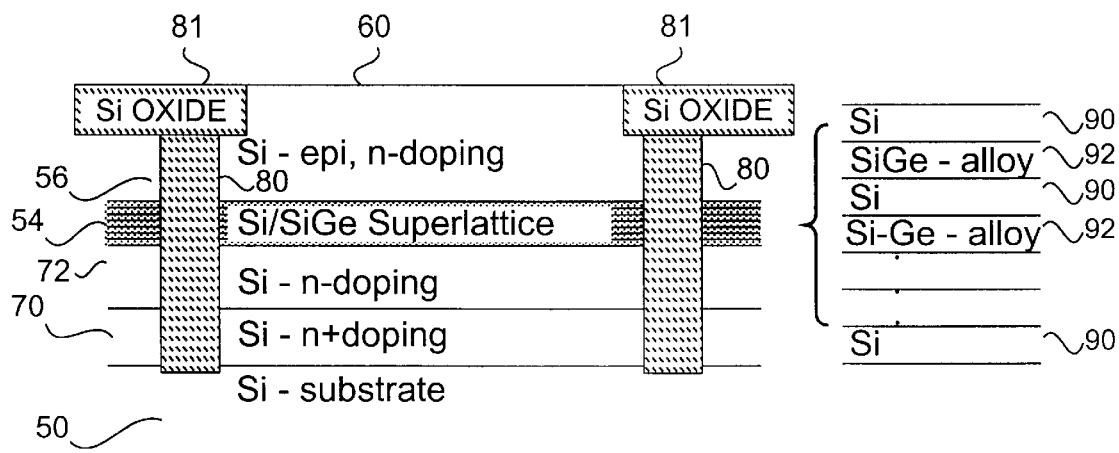
FIG. 8b is a cross-sectional view through a semiconductor optical channel waveguide comprising part of an integrated optoelectronic integrated circuit according to a fourth embodiment of the present invention.

A fourth embodiment of the invention is illustrated in FIG. 8b in which a superlattice core 54 has been employed together with trenches 80 for lateral isolation. The other layers are identical to those shown in FIG. 7. Of course, any appropriate predetermined series of layers in the core as discussed above could also be employed with this embodiment, so long as the required optical confinement of light to the core is achieved.

A core having a predetermined series of layers in the core may also be used with the undoped layered structure of FIG. 5a or with an undoped layered trench structure.

Other electronic, optical, optoelectric or electrooptic components can be easily fabricated on any of the layer structures of the above described embodiments, for example by appropriately doping regions of the layers, provided that the crystals forming the layers result in a substantially dislocation free crystal. Shown in FIG. 9 by way of example is a waveguide 100, a diffused resistor 102, and an NPN transistor 104 all of which have been fabricated on the same set of semiconductor layers. The diffused resistor is constructed by forming an n+doped region 70 in the buried layer and a p+doped region 106 in one well 60, and the transistor is constructed by using another portion of the n+doped region 70 and forming a p+doped region 108 in another well. Each of the devices is substantially electrically and optically isolated from adjacent devices.

Figure 10:
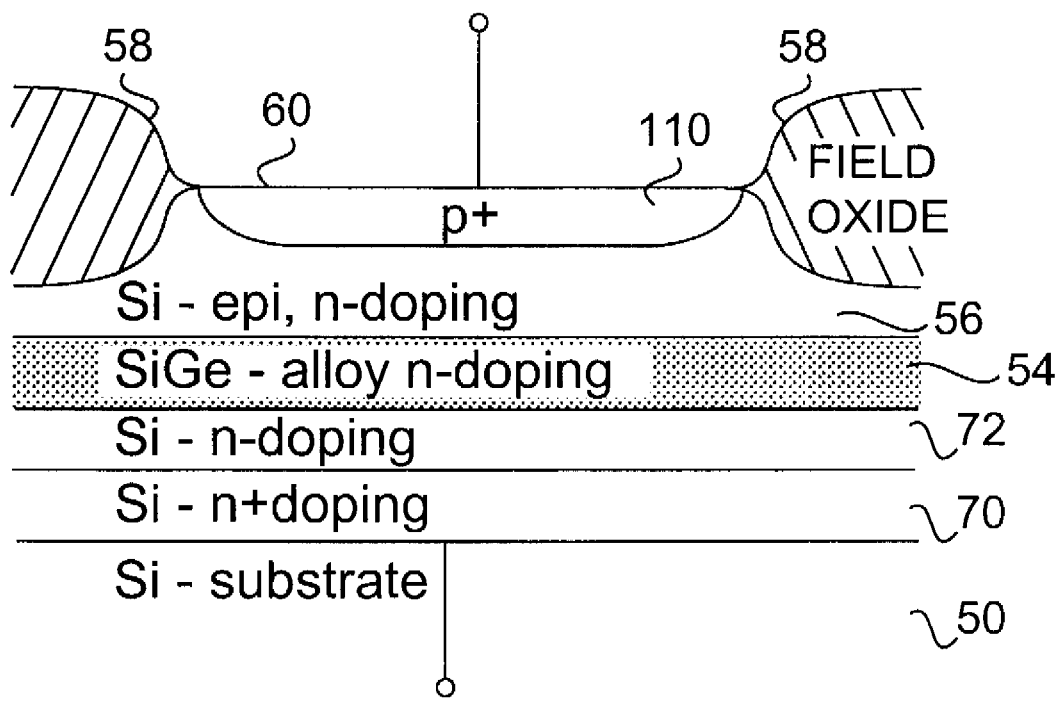
FIG. 10 is a cross-sectional view of a P-i-N channel waveguide photodetector constructed according to the invention.

A fifth embodiment of the invention comprises a semiconductor optical waveguide photodetector fabricated as part of an optoelectronic integrated circuit as seen in FIG. 10. In this case, the doped semiconductor layer structure of FIG. 6 has again been employed. Overlying the top lightly doped silicon layer 56, there is provided a layer of p+doped silicon 110 in the well 60. This p+doped silicon 110 forms a top contact layer and forms the P type component of a P-i-N junction photodetector. The photodetector uses the device well 60 to establish lateral optical energy confinement, a core layer 54 of SiGe alloy to establish vertical optical energy confinement, and heavily doped P and N layers 110,70 to form a P-i-N junction photodiode. Alternatively, the P and N regions could be reversed, thereby forming a N-i-P junction photodiode. The core layer could alternatively be a predetermined series of layers as discussed previously with respect to the third and fourth embodiments. The core and cladding layers for both the N-i-P and P-i-N junction diodes must form a crystal which is substantially dislocation free.

According to the invention, semiconductor optical channel waveguides (according to the first, second, third and fourth embodiments) and semiconductor optical waveguide photodetectors (according to the fifth embodiment) may be fabricated by methods compatible with conventional processes for the fabrication of devices such as bipolar, CMOS and bipolar CMOS integrated circuits.

Figure 11:
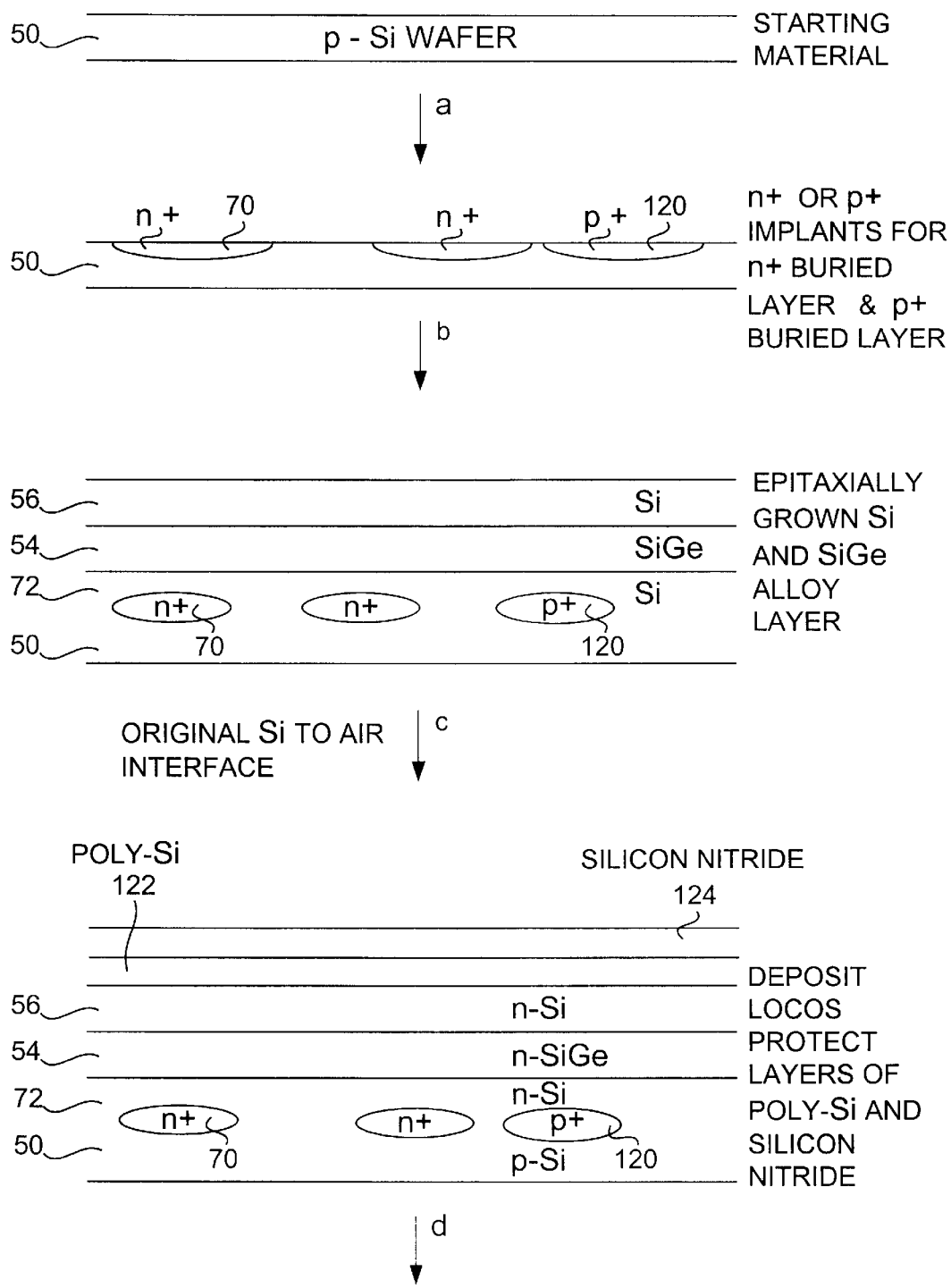
FIG. 11 is a process flow diagram for a typical fabrication process employing LOCOS regions.
Figure 11:
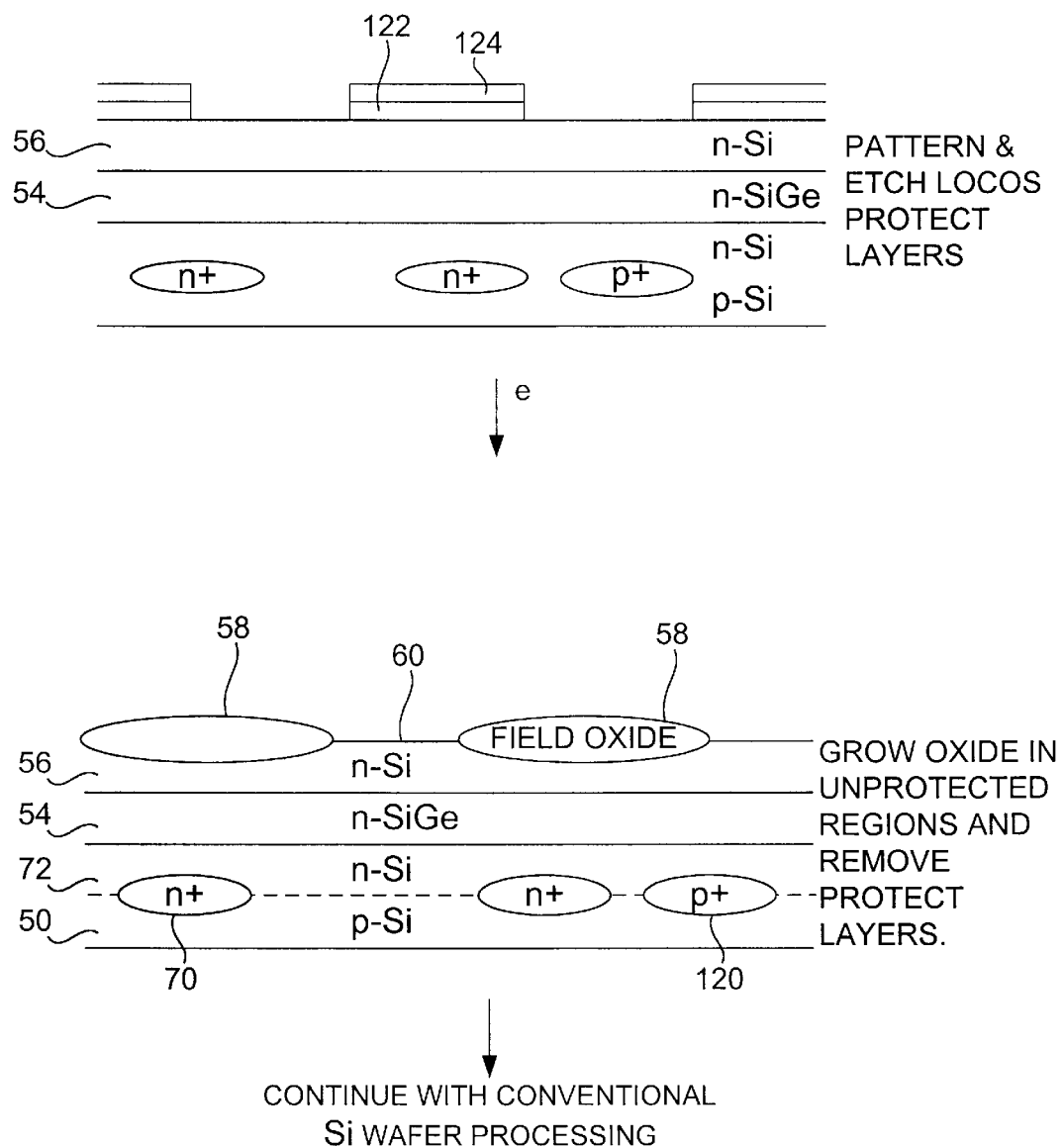

A typical example of a fabrication sequence is given in FIG. 11. The starting material is a silicon substrate 50 which may be p–doped. A n+doped buried layer 70 is formed in a conventional manner (step a), i.e. by selectively masking, by coating with photoresist and patterning, followed by ion implantation and, photoresist stripping, and annealing. In this manner, the n+doped buried layer 70 is defined in predetermined locations on the wafer. Regions of P doping 120 may be formed in a similar manner. Following this an n–doped silicon layer 72, an n–doped $Si_{1-x}Ge_x$ alloy layer 54, and a final n–doped silicon layer 56 are deposited on the substrate 50 by a known method e.g. by epitaxial growth of silicon or silicon germanium alloy as the case may be, or, specifically relating to the silicon germanium alloy, by formation of a layer of silicon followed by ion implantation of germanium and annealing (step b). In this manner, the bottom cladding, the waveguide core, and the top cladding are provided and a structure which allows the formation of a plurality of devices such as waveguides or electronic devices is formed. In another example, the core region 54 of the waveguide may be a predetermined series of silicon alloys with or without layers of silicon, such as a superlattice structure consisting of a series of alternating Si and $Si_{1-x}Ge_x$ alloy layers.

Referring again to FIG. 11, definition and formation of the channel waveguide is achieved by forming the device well. In the case in which LOCOS regions are used to define the device well or for lateral waveguide definition, LOCOS protect layers of polysilicon 122 and silicon nitride 124 are deposited (step c). These layers are then patterned and etched in the usual manner (step d). Oxide 58 is then grown on the unprotected regions, and the protect layers are removed (step e).

Figure 12:
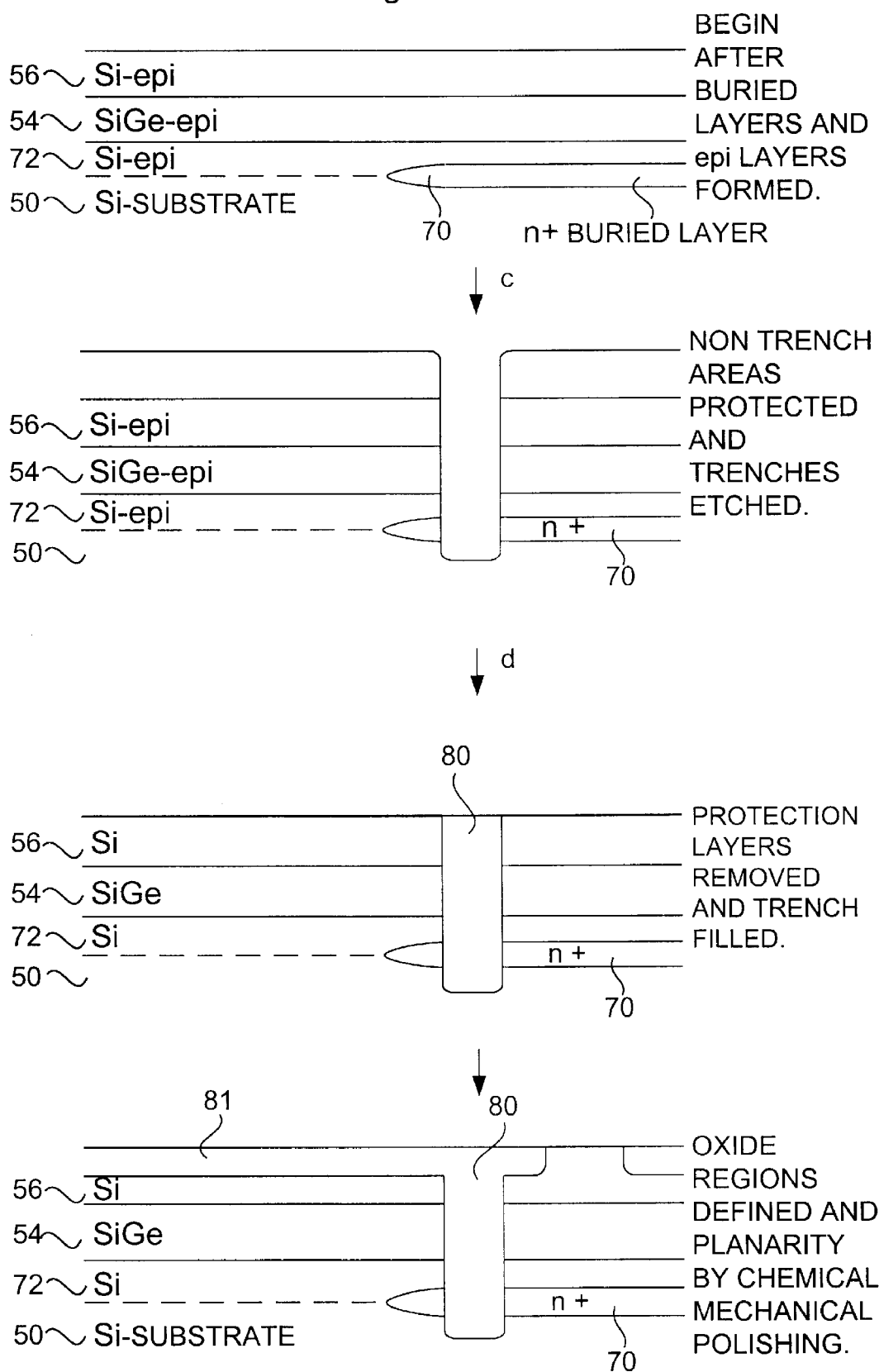
FIG. 12 is a process flow diagram for a typical fabrication process for the formation of a trench.

FIG. 12 shows a typical example of a process flow which would be used when trenches are used to define the channel waveguide. The process is the same as that described with reference to FIG. 11 for steps a and b, and these steps are not shown in the figure. Selected regions are protected in a conventional manner from the trench process and the trenches etched (step c). The protection layers are then removed and the trenches filled with a suitable material such as oxide thereby providing the left and right cladding and device well definition (step d). The shallow trenches are similarly deposited and made planar by chemical-mechanical polishing (step e).

In the embodiment describing the semiconductor optical waveguide photodetector seen in FIG. 10, after the formation of the left and right cladding regions 58, the device well 60 is implanted to form a p+doped region 110 and annealed. A conductive channel to the buried region 70 is provided (not shown) in a conventional manner, through a heavily doped region which extends down from an adjacent well through all of the layers to contact the buried region. Electrically conductive contacts to the p+doped region 110 and to the conductive channel in the adjacent well are provided by conventional known processes.

Although particular embodiments of the invention have been described in detail, numerous modifications, variations and adaptations may be made without departing from the scope of the invention as defined in the claims.

For example, with respect to the embodiments having a single alloy layer in the core, elements other than germanium may be used in the core alloy. In the embodiments employing a predetermined series of layers in the core, the core may comprise a series of layers of various silicon alloys which may or may not include layers of silicon. In both cases, suitable alloys include SiGe and other binary and ternary group IV compounds such as SiC and SiGeC. In addition, the cladding layers may be a silicon alloy rather than just silicon.

The alloy compositions of the various layers forming the waveguides do not necessarily have to be uniform. For example in a waveguide having a single layer silicon-germanium core, the germanium content might vary from 0% at one core/cladding interface to 10% in the centre of the core and back to 0% at the other core/cladding interface. When the core is composed of a series of layers, each layer may have a non-uniform alloy composition. Similar variations are possible in the cladding layers. These variations in the composition of the various layers will contribute to determining the shape of the modes of the waveguide and to the definition of the optical confinement factor.

Several design decisions exist in choosing a material for the core and cladding. Firstly, the core material must be chosen so as to result in a predetermined increase in the index of refraction in the core with respect to the cladding. For example, if both the core and the cladding are a SiGe alloy, then the core must have a larger germanium content than the cladding layers for it to have a larger index of refraction. Secondly, the layer materials, alloy fractions and layer thicknesses must be such that the resulting crystal is substantially dislocation free if other electronic devices are to be fabricated which impose this requirement. Finally, if other electronic devices are to be fabricated on the same substrate, the alloy must have no appreciable effect on the ability to perform such fabrication. This has an effect on which silicon alloys are suitable.

References

[1] F. Namavar and R. A. Soref, "Optical waveguiding in Si/Ge$_x$Si$_{1-x}$/Si heterostructures," *J. Appl. Phys.*, vol. 70, pp. 3370–3372, Sep. 15, 1991.

[2] R. A. Soref, "Silicon-Based Optoelectronics", *Proceedings of the IEEE,* vol. 81. No. 12, December 1983.

We claim:

1. A semiconductor optical channel waveguide comprising:
   a silicon substrate;
   a bottom cladding layer made of silicon formed on the silicon substrate;
   a top cladding layer made of silicon;
   a core formed between the bottom cladding layer and the top cladding layer and comprising at least one layer of a silicon semiconductor alloy, the core having a predetermined increase in the index of refraction relative to the top and bottom cladding layers; and
   first and second spaced trench regions extending through at least a portion of the top cladding layer and filled with a material, the material having an index of refraction less than that of the cladding in the case the trenches do not penetrate the core, the material having an index of refraction less than that of the core in the case the trenches do penetrate the core, thereby defining lateral boundaries of a channel in the core.

2. A structure according to claim 1 wherein the layers within the core comprise a crystal which is substantially free of dislocations.

3. A structure according to claim 2 wherein the trench regions extend through the bottom cladding layer to the substrate.

4. A structure according to claim 3 wherein the core is formed of a single layer of a silicon semiconductor alloy.

5. A structure according to claim 3 wherein the core comprises a series of layers each of which is silicon or a silicon alloy.

6. A structure according to claim 5 wherein the series of layers comprise layers of silicon alternating with layers of silicon alloy.

7. A structure according to claim 5 wherein the series of layers comprise a superlattice.

8. A structure according to claim 5 wherein the series of layers comprise a multiple quantum well.

9. A structure according to claim 4 wherein the silicon alloy in the core is Si$_{1-x}$Ge$_x$ where x is in the range 1>x>0, and where x is selected to provide said predetermined increase in the index of refraction in the core.

10. A structure according to claim 5 wherein the silicon alloy in the core is Si$_{1-x}$Ge$_x$ where x is in the range 1>x>0, and where x is selected to provide said predetermined increase in the index of refraction in the core.

11. A structure according to claim 6 wherein the silicon alloy in the core is Si$_{1-x}$Ge$_x$ where x is in the range 1>x>0, and where x is selected to provide said predetermined increase in the index of refraction in the core.

12. A structure according to claim 7 wherein the silicon alloy in the core is Si$_{1-x}$Ge$_x$ where x is in the range 1>x>0, and where x is selected to provide said predetermined increase in the index of refraction in the core.

13. A structure according to claim 4 wherein the silicon alloy is Si$_{1-x}$Ge$_x$ where x is in the range 0.01–0.1, and where x is selected to provide said predetermined increase in the index of refraction in the core.

14. A structure according to claim 5 wherein the silicon alloy is Si$_{1-x}$Ge$_x$ where x is in the range 0.01–0.1, and where x is selected to provide said predetermined increase in the index of refraction in the core.

15. A structure according to claim 6 wherein the silicon alloy is Si$_{1-x}$Ge$_x$ where x is in the range 0.01–0.1, and where x is selected to provide said predetermined increase in the index of refraction in the core.

16. A structure according to claim 7 wherein the silicon alloy is Si$_{1-x}$Ge$_x$ where x is in the range 0.01–0.1, and where x is selected to provide said predetermined increase in the index of refraction in the core.

17. A structure according to claim 3 wherein the core and cladding layers comprise a crystal which is substantially free of dislocations.

18. A structure according to claim 17 wherein regions of n+doping or regions of p+doping are buried in the bottom cladding layer or in the substrate.

19. A structure according to claim 17 wherein a layer of n+doping or p+doping is buried in the bottom cladding layer or in the substrate.

20. A structure according to claim 17 wherein
   a region of n+doping is buried in the bottom cladding layer or in the substrate;
   the bottom cladding layer, core layer and top cladding layer are n–doped;
   further comprising a p+doped layer of silicon overlying said top cladding layer above said buried n+doped region;
   thereby forming a P-i-N photodetector diode.

21. A structure according to claim 17 wherein a region of p+doping is buried in the bottom cladding layer or in the substrate;
   the bottom cladding layer, core layer and top cladding layer are n–doped;
   further comprising a n+doped layer of silicon overlying said top cladding layer above said buried n+doped region;
   thereby forming a N-i-P photodetector diode.

22. A structure according to claim 17 wherein the bottom cladding layer, core layer and top cladding layer are n–doped.

23. The structure according to claim 3 wherein the trench regions are filled with silicon dioxide.

24. The structure according to claim 3 wherein the trench regions have a silicon oxide liner and are filled with polysilicon.

25. The structure according to claim 3 wherein the trench regions are filled with a polymer.

26. A semiconductor optical channel waveguide comprising:

a substrate;

a bottom cladding layer made of silicon or a silicon alloy;

a top cladding layer made of silicon or a silicon alloy;

a core formed between the bottom cladding layer and the top cladding layer and comprising at least one layer of a silicon semiconductor alloy, the core having a predetermined increase in the index of refraction relative to the top and bottom cladding layers; and first and second spaced trench regions extending through at least a portion of the top cladding layer and filled with a material, the material having an index of refraction less than that of the cladding in the case the trenches do not penetrate the core, the material having an index of refraction less than that of the core in the case the trenches do penetrate the core, thereby defining lateral boundaries of a channel in the core.

27. The structure according to claim 26 wherein the trench regions are filled with silicon dioxide.

28. The structure according to claim 26 wherein the trench regions have a silicon oxide liner and are filled with polysilicon.

29. The structure according to claim 26 wherein the trench regions are filled with a polymer.

* * * * *